United States Patent
Kobayashi et al.

(10) Patent No.: US 9,590,168 B2
(45) Date of Patent: Mar. 7, 2017

(54) ALKALI NIOBATE-BASED PIEZOELECTRIC MATERIAL AND A METHOD FOR MAKING THE SAME

(75) Inventors: Ryosuke Kobayashi, Tokyo (JP); Akihiro Mitani, Tokyo (JP); Yoshinari Oba, Tokyo (JP)

(73) Assignee: FDK Corporation, Tokyo (JP)

( * ) Notice: Subject to any disclaimer, the term of this patent is extended or adjusted under 35 U.S.C. 154(b) by 213 days.

(21) Appl. No.: 14/000,739

(22) PCT Filed: Feb. 14, 2012

(86) PCT No.: PCT/JP2012/053384
§ 371 (c)(1),
(2), (4) Date: Dec. 3, 2013

(87) PCT Pub. No.: WO2012/114938
PCT Pub. Date: Aug. 30, 2012

(65) Prior Publication Data
US 2014/0077119 A1    Mar. 20, 2014

(30) Foreign Application Priority Data

Feb. 22, 2011 (JP) ................. 2011-035782
Nov. 24, 2011 (JP) ................. 2011-256486

(51) Int. Cl.
*H01L 41/18* (2006.01)
*H01L 41/43* (2013.01)
(Continued)

(52) U.S. Cl.
CPC ........ *H01L 41/1873* (2013.01); *C04B 35/495* (2013.01); *H01L 41/43* (2013.01);
(Continued)

(58) Field of Classification Search
CPC .......................... H01L 41/43; H01L 41/1873
See application file for complete search history.

(56) References Cited

U.S. PATENT DOCUMENTS 8,471,442 B2   6/2013  Hatano et al.
2008/0061263 A1*  3/2008  Kawada et al. ....... 252/62.9 PZ
2009/0243439 A1* 10/2009  Furukawa ............. C04B 35/495
                                                              310/358

FOREIGN PATENT DOCUMENTS

CN           101115694 A     1/2008
EP             2113952 A2   11/2009
(Continued)

OTHER PUBLICATIONS

Lin. Structure, dielectric, and piezoelectric properties of CuO-doped K0.5Na0.5NbO3—BaTiO3 lead-free ceramics. Journal of Applied Physics 102, 074113 2007.*
(Continued)

*Primary Examiner* — Matthew E Hoban
(74) *Attorney, Agent, or Firm* — McDermott Will & Emery LLP (57) ABSTRACT

An alkali niobate-based piezoelectric material having the general formula $\{(K_{1-a}Na_a)_{1-b}Li_b\}(Nb_{1-c-d}Ta_cSb_d)O_3 + x$ mol % $Ba_nTiO_3 + y$ mol % CuO,
where $0 \leq a \leq 0.9$, $0 \leq b \leq 0.3$, $0 < c \leq 0.5$, $0 \leq d \leq 0.1$, $0.5 \leq x < 10.0$, $0.1 \leq y \leq 8.0$, and $0.9 \leq n \leq 1.2$.

2 Claims, 7 Drawing Sheets

(51) Int. Cl.
  *H01L 41/187* (2006.01)
  *C04B 35/495* (2006.01)
(52) U.S. Cl.
  CPC ............... *C04B 2235/3201* (2013.01); *C04B 2235/3203* (2013.01); *C04B 2235/3215* (2013.01); *C04B 2235/3217* (2013.01); *C04B 2235/3236* (2013.01); *C04B 2235/3251* (2013.01); *C04B 2235/3262* (2013.01); *C04B 2235/3272* (2013.01); *C04B 2235/3275* (2013.01); *C04B 2235/3279* (2013.01); *C04B 2235/3281* (2013.01); *C04B 2235/3284* (2013.01); *C04B 2235/3298* (2013.01)

(56) References Cited

FOREIGN PATENT DOCUMENTS

| | | |
|---|---|---|
| JP | 56-012031 B2 | 3/1981 |
| JP | 2009-242166 A | 10/2009 |
| JP | 2009-242167 A | 10/2009 |
| JP | 2010-180121 A | 8/2010 |
| JP | 2011-190147 A | 9/2011 |
| JP | 2012-020918 A | 2/2012 |
| WO | 2006117990 A1 | 11/2006 |
| WO | 2010-128647 A1 | 11/2010 |

OTHER PUBLICATIONS

International Search Report and Written Opinion, with English translation, issued in Application No. PCT/JP2012/05384 dated Apr. 24, 2012.
International Search Report issued in International application No. PCT/JP2012/053384 mailed Apr. 24, 2012.
FDK Corporation, "piezoelectric ceramics (technical document)", search result on Feb. 9, 2011, www.fdk.co.jp/cyber-j/pdf/BZ-TEJ001.pdf, with English Translation.
NEC Tokin Corporation, "piezoelectric ceramics vol. 04", search result on Jan. 18, 2011, www.nec-tokin.com/product/piezodevice1/pdf/piezodevice_j.pdf, with English Translation.
Notification of the First Office Action Chinese Patent Application No. 201280009879.5 dated Apr. 23, 2014.
Office Action German Patent Application No. 112012000933.9 dated Aug. 17, 2015.
Office Action Japanese Patent Application No. 2011-035782 dated Jan. 27, 2015.
Office Action Japanese Patent Application No. 2011-256486 dated Jan. 27, 2015.
Decision of Rejection Chinese Patent Application No. 201280009879.5 dated Apr. 15, 2015 with full English translation.
Reexamination Decision issued in Chinese Application No. 201280009879.5 dated Nov. 3, 2016, with English translation.

* cited by examiner

ALKALI NIOBATE-BASED PIEZOELECTRIC MATERIAL AND A METHOD FOR MAKING THE SAME

RELATED APPLICATIONS

This application is the U.S. National Phase under 35 U.S.C. §371 of International Application No. PCT/JP2012/53384, filed on Feb. 14, 2012, which in turn claims the benefit of Japanese Application Nos. 2011-035782, filed on Feb. 22, 2011 and 2011-256486, filed on Nov. 24, 2011 the disclosures of which Applications are incorporated by reference herein.

TECHNICAL FIELD

The invention relates to an alkali niobate-based piezoelectric material and a method for making the same.

BACKGROUND ART

As piezoelectric material, well known is PZT ($PbTiO_3$—$PbZrO_3$)-based ceramics. PZT has excellent piezoelectric properties such as electromechanical coupling coefficient and piezoelectric constant; PZT is widely used in piezoelectric elements of a device such as a sensor, an ultrasonic motor, and a filter.

Incidentally, because of environmental demands, there is urgent need for lead-free products in recent years. Since PZT is used in industrial product, it goes without saying that it is necessary to replace PZT as piezoelectric material containing lead (Pb) with another piezoelectric material containing no lead.

Piezoelectric materials containing no lead (lead-free piezoelectric material) could include: barium titanate ($Ba_nTiO_3$)-based piezoelectric materials; alkali niobate-based piezoelectric materials such as compounds (KNN) having the general formula $K_xNa_{(1-x)}NbO_3$ and compounds having the general formula $(K_{1-a}Na_a)_{1-b}Li_b(Nb_{1-c-d}Ta_cSb_d)O_3$; and the like. It should be noted that piezoelectric material containing KNN as the main component (hereinafter referred to as KNN-based piezoelectric material) is described in [PTL 1] mentioned below. [PTL 1] discloses a piezoelectric material in which the value x of KNN is $0.02 \leq x \leq 0.5$ and in which at least either of $Fe_2O_3$ or $Co_2O_3$ is added to KNN. Common techniques of piezoelectric material are described in detail in [NPL 1] and [NPL 2] described below.

CITATION LIST

Patent Literature

[PTL 1] Japanese Examined Patent Publication No. 56-12031

Non Patent Literature

[NPL 1] FDKCorporation, "piezoelectric ceramics (technical document)", [online], [search result on Feb. 9, 2011], Internet <URL:http://www.fdk.co.jp/cyber-j/pdf/BZ-TEJ001.pdf>.
[NPL 2] NEC TOKIN Corporation, "piezoelectric ceramics Vol. 04", [online], [search result on Jan. 18, 2011], Internet <URL:http://www.nec-tokin.com/product/piezodevicel/pdf/piezodev ice_j.pdf>

SUMMARY OF THE INVENTION

Technical Problem

The inventors considered the foregoing environmental background, and attempted to improve properties of alkali niobate-based piezoelectric material. The inventors have invented a KNN-based piezoelectric material having improved moisture resistance while maintaining piezoelectric performances for practical use, and filed a patent application thereof (Japanese Patent Application No. 2010-39062: prior invention 1).

Also, as for other alkali niobate-based piezoelectric materials than KNN, the inventors explored compositions or additional matters; specifically speaking, the inventors explored the moisture resistance of a compound having the general formula $(K_{1-a}Na_a)_{1-b}Li_b(Nb_{1-c-d}Ta_cSb_d)O_3$. In the course of their research, the inventors found the using of an appropriate percentage composition of the compound (values a to d in the general formula) and the adding of glass. Thereby, the inventors have invented a piezoelectric material having improved moisture resistance while maintaining piezoelectric performances for practical use, and filed a patent application thereof (Japanese Patent Application No. 2010-57735: prior invention 2, Japanese Patent Application No. 2010-161855: prior invention 3).

Thus, an aspect of the invention is to provide a piezoelectric material that are environmentally friendly and whose piezoelectric properties are excellent and balanced.

Incidentally, the inventors are studying this subject wholeheartedly in order to further improve piezoelectric properties (electromechanical coupling coefficient Kp, mechanical quality factor Qm, and relative dielectric constant $\in r$) of alkali niobate-based piezoelectric material. In their studying, the inventors found that, concerning alkali niobate-based piezoelectric materials, it is difficult to do simultaneously the following things: improving piezoelectric properties (electromechanical coupling coefficient Kp, mechanical quality factor Qm, and relative dielectric constant $\in r$); and balancing all of these piezoelectric properties. In particular, it was found that Qm and $\in r$ are in an inverse relationship to each other, and that it is extremely difficult to further improve both Qm and $\in r$ at the same time by extension of the techniques according to the prior inventions 1 to 3.

For example, the prior inventions 2 and 3 are alkali niobate-based piezoelectric materials in which the substance from which their piezoelectric properties originates (hereinafter referred to as a base material) is a compound having the general formula $\{(K_{1-a}Na_a)_{1-b}Li_b\}(Nb_{1-c-d}Ta_cSb_d)O_3$ and in which glass and an oxide of copper (Cu) are added to the base material. The piezoelectric materials according to these inventions have more excellent properties than traditional alkali niobate-based piezoelectric materials, but it is difficult to improve both of mechanical quality factor Qm and relative dielectric constant $\in r$.

Thus, the inventors explored piezoelectric material whose main base material is $Ba_nTiO_3$, which is one of lead-free piezoelectric materials other than the alkali niobate-based piezoelectric materials. However, that piezoelectric material has major problems for practical use because $Ba_nTiO_3$ has low Curie temperature and is depolarized at about 100° C. to lose piezoelectric properties. In addition, since its sintering temperature is about 1300° C., this makes it difficult to produce dense structures. This mechanical weakness causes a problem with low productivity because the material is easily broken while being processed into a certain shape.

Thus, an aspect of the invention is to provide alkali niobate-based piezoelectric material whose piezoelectric properties are extremely excellent and well-balanced. Also, another aspect of the invention is to provide a method for making the piezoelectric material.

As mentioned above, though alkali niobate-based piezoelectric material and $Ba_nTiO_3$ are both expected as practicable lead-free piezoelectric materials, both piezoelectric materials have problems to solve. Thus, the inventors thought that a piezoelectric material containing both of alkali niobate-based piezoelectric material and $Ba_nTiO_3$ may compensate for their disadvantages so that it becomes possible to further improve the properties of Qm and $\in$r and to prevent productivity from going down. Then, the inventors explored the following configuration of a piezoelectric material and a making method for the piezoelectric material: a compound to be a piezoelectric material; the percentage composition of the compound; the types and amounts of additional matters; or the like. Then, the inventors have achieved the invention Solution to Problem The invention is a piezoelectric material having the general formula $\{(K_{1-a}Na_a)_{1-b}Li_b\}(Nb_{1-c-d}Ta_cSb_d)O_3 + x$ mol % $Ba_nTiO_3 + y$ mol % CuO, where $0 \leq a \leq 0.9$, $0 \leq b \leq 0.3$, $0 < c \leq 0.5$, $0 \leq d \leq 0.1$, $0.5 \leq x < 10.0$, $0.1 \leq y \leq 8.0$, and $0.9 \leq n \leq 1.2$.

Also, the invention is a method for making an alkali niobate-based piezoelectric material having the general formula $\{(K_{1-a}Na_a)_{1-b}Li_b\}(Nb_{1-c-d}Ta_cSb_d)O_3 + x$ mol % $Ba_nTiO_3 + y$ mol % CuO where $0 \leq a \leq 0.9$, $0 \leq b \leq 0.3$, $0 < c \leq 0.5$, $0 \leq d \leq 0.1$, $0.5 \leq x < 10.0$, $0.1 \leq y \leq 8.0$, and $0.9 \leq n \leq 1.2$, the method comprising:

mixing a solvent and a raw material of a compound that is the piezoelectric material;

primary-heating a mixture of the solvent and the raw material of the compound, at a temperature lower than a sintering temperature;

forming into a certain shape the primary-heated mixture in which a binder is added; and heating the shaped product to sinter in an oxygen atmosphere.

Further, the invention may be a method for making alkali niobate-based piezoelectric material, wherein the piezoelectric material contains compound having the general formula $K_xNa_{(1-x)}NbO_3$.

Effects of the Invention

According to the invention, it is possible to provide a piezoelectric material that are environmentally friendly and whose piezoelectric properties are excellent and balanced, and to provide a method for making the piezoelectric material.

MODE FOR CARRYING OUT THE INVENTION

===Technical Idea of the Invention===

The foregoing prior inventions 2 and 3 include piezoelectric materials having more excellent properties which are realized by adding glass and an oxide of copper (Cu) to a compound (hereinafter referred to as a base material) having the general formula $(K_{1-a}Na_a)_{1-b}Li_b(Nb_{1-c-d}Ta_cSb_d)O_3$. However, it is found that, even if an oxide of copper (Cu) is added to the base material, piezoelectric materials in which the substance from which their piezoelectric properties originates is only the base material are difficult to improve both of mechanical quality factor Qm and relative dielectric constant $\in$r. Therefore, though KNN serves as the base material or a part of the base material, the use of $Ba_nTiO_3$, which is one of lead-free piezoelectric materials other than KNN, was considered. However, while a heating temperature for sintering $Ba_nTiO_3$ alone is high about 1300° C., sintering the base material at 1300° C. causes alkaline components to vaporize or dissolve. That is, if $Ba_nTiO_3$ is used as a base material or a part of base material, the heating temperature needs to be lower than 1300° C. In this case, naturally, the relative density lowers, which fails to produce a dense structure. This causes the following problems: deterioration of piezoelectric properties; and breakage at the time of processing because of mechanical weakness. Also, since $Ba_nTiO_3$ has a low Curie temperature, containing substantially the same amount of $Ba_nTiO_3$ as the base material will lower the Curie temperature, which may cause some problems.

The inventors need paradigm shift in order to solve the foregoing problems. So, the inventors considered that a piezoelectric material containing both of the base material and $Ba_nTiO_3$ can compensate for their disadvantages so that it is possible to further improve properties of Qm and $\in$r and to prevent productivity from going down. Then, the inventors have realized the invention through knowledge obtained when the inventors realized in the prior inventions 2 and 3 and through the subsequent studies based on the abovementioned considerations.

===Piezoelectric Material===

A piezoelectric material according to the invention is one having the empirical formula $\{(K_{1-a}Na_a)_{1-b}Li_b\}(Nb_{1-c-d}Ta_cSb_d)O_3 + x$ mol % $Ba_nTiO_3 + y$ mol % CuO where $0 \leq a \leq 0.9$, $0 \leq b \leq 0.3$, $0 < c \leq 0.5$, $0 \leq d \leq 0.1$, $0.5 \leq x \leq 7.0$, $0.9 \leq n \leq 1.2$, and $0.1 \leq y \leq 8.0$. It has been confirmed that the piezoelectric material (hereinafter referred to as a piezoelectric material A) has excellent piezoelectric properties that are balanced.

===Procedure for Making Piezoelectric Material===

The piezoelectric material A of the examples of the invention is obtained by sintering a mixture in which an additive is added to the following raw material: a base material and $Ba_nTiO_3$ from which the piezoelectric properties originates. A plurality of piezoelectric materials that are different in the following compositions were prepared as samples: the percentage composition of the base material (values of a to d in the foregoing general formula); an amount of $Ba_nTiO_3$ (value of x); amounts of other additional matters; and the like. One of the plurality of piezoelectric materials is the piezoelectric material A according to the examples of the invention. Note that as the additive, CuO is used because of its performances in the prior inventions 2 and 3. Taking into consideration the abovementioned problems of sintering temperature and/or Curie temperature of $Ba_nTiO_3$, a piezoelectric material containing $Ba_nTiO_3$ of substantially the same amount as a base material may lead to the following problems: breakage of the piezoelectric material at the time of processing, caused by its mechanical weakness; and lowering of Curie temperature. Therefore, desirably, the main component is the base material and $Ba_nTiO_3$ is contained as an additive (aid) which improves properties of the base material, like CuO.

General piezoelectric materials are ceramics, and are obtained Basically by means of sintering a mixture in which an additive is added to a substance from which the piezoelectric properties originates. A making method according to the second example is subject to this basic procedure. However, in the making method of the second example, it is possible to further improve properties of the piezoelectric materials A by employing alkali niobate-based piezoelectric materials and taking appropriate sintering conditions.

FIGS. 1A and B respectively show a procedure of a making method according to the first example and a procedure of a making method according to the second example.

===Making Method According to First Embodiment===

In the making method according to the first example shown in FIG. 1A, a certain amount of raw materials of the piezoelectric material A are weighed and blended (s1), and the raw materials and alcohol (e.g., ethanol) which serves as a solvent are immersed in a ball mill and are mixed (s2). Thereby, the raw materials of the piezoelectric material A are mixed and milled into powder. Then, the mixture is primary-heated in air at 950° C. for 1 to 10 hours (s3).

Next, a powder obtained by primary-heating is mixed into a liquid for 24 hours, and after adding to the mixture PVA solution as a binder, the mixture is mixed and milled; thereby, a powder having a suitable particle size is granulated (s4). The granulated powder is shaped into an intended shape (s5). Then, the shaped product is left at a certain temperature (for example, at temperatures of 300 to 500° C.) and the binder is removed from the product, and thereafter, the product is heated in air at temperatures of 900 to 1200° C. for 1 hour (s7), to obtain a piezoelectric ceramic. The piezoelectric ceramic is processed into a disk having a diameter ϕ more than or equal to 15 mm and a thickness t of 1.0 mm (s8), and is electroded with Ag onto both surfaces of the disk (s9). Finally, the piezoelectric ceramic is poled in silicone oil at 120° C. with an electric field of 4 Kv/mm for 30 minutes, to make a piezoelectric material (s10).

===Making Method According to Second Example===

On the other hand, in a making method according to the second example shown in FIG. 1B, the mixture is heated in an oxygen atmosphere in a heating process (s17), which is different from the making method of the first example. In the making method of the first example, the heating process (s7) is performed in air. Except for the heating process (s17), the other processes (s11) to (s16) and (s18) to (s20) are the same as processes (s1) to (s6) and (s8) to (s10) of the making method of the first example. In the making methods of the first and the second examples, various piezoelectric material A's whose compositions (values of a to d, x, y, and n) are different are prepared as samples. It should be noted that samples whose values of a to d, x, y, and n are out of the ranges defined in the prior invention 3 are prepare at the same time.

===Composition of Sample===

The technical idea on which the invention is based is that adding both of CuO and $Ba_nTiO_3$ (aids) to a base material (piezoelectric substance) compensates for disadvantages to improve various piezoelectric properties as a whole. However, if their percentage composition and the value n of $Ba_nTiO_3$ are determined carelessly, this prevents compensating for their disadvantages and causes their advantages to cancel out. It goes without saying that it is necessary to pay attention to the composition of the base material. Thus, prepared are 30 samples (Nos. 1 to 30) of piezoelectric materials having the general formula $\{(K_{1-a}Na_a)_{1-b}Li_b\}(Nb_{1-c-d}Ta_cSb_d)O_3 + x$ mol % $Ba_nTiO_3 + y$ mol % CuO whose values of a to d, x, y, and n are different. Piezoelectric properties of each of the samples are measured.

Table 1 below shows compositions of the prepared samples (Nos. 1 to 30).

TABLE 1

Piezoelectric Material A
$\{(K_{1-a}Na_a)_{1-b}Li_b\}(Nb_{1-c-d}Ta_cSb_d)O_3 +$
x mol % $Ba_nTiO_3$ + y mol % CuO

| No. | x | y | a | b | c | d | n |
|---|---|---|---|---|---|---|---|
| 1 | * 0.0 | 2.0 | 0.50 | 0.04 | 0.10 | 0.04 | * — |
| 2 | 0.5 | 2.0 | 0.50 | 0.04 | 0.10 | 0.04 | 1.0 |
| 3 | 3.0 | 2.0 | 0.50 | 0.04 | 0.10 | 0.04 | 1.0 |
| 4 | 7.0 | 2.0 | 0.50 | 0.04 | 0.10 | 0.04 | 1.0 |
| 5 | * 10.0 | 2.0 | 0.50 | 0.04 | 0.10 | 0.04 | 1.0 |
| 6 | 3.0 | 2.0 | 0.00 | 0.04 | 0.10 | 0.04 | 1.0 |
| 7 | 3.0 | 2.0 | 0.90 | 0.04 | 0.10 | 0.04 | 1.0 |

TABLE 1-continued

Piezoelectric Material A
$\{(K_{1-a}Na_a)_{1-b}Li_b\}(Nb_{1-c-d}Ta_cSb_d)O_3 +$
x mol % $Ba_nTiO_3$ + y mol % CuO

| No. | x | y | a | b | c | d | n |
|---|---|---|---|---|---|---|---|
| 8 | 3.0 | 2.0 | * 0.95 | 0.04 | 0.10 | 0.04 | 1.0 |
| 9 | 3.0 | 2.0 | 0.50 | 0.00 | 0.10 | 0.04 | 1.0 |
| 10 | 3.0 | 2.0 | 0.50 | 0.30 | 0.10 | 0.04 | 1.0 |
| 11 | 3.0 | 2.0 | 0.50 | * 0.40 | 0.10 | 0.04 | 1.0 |
| 12 | 3.0 | 2.0 | 0.50 | 0.04 | 0.00 | 0.04 | 1.0 |
| 13 | 3.0 | 2.0 | 0.50 | 0.04 | 0.02 | 0.04 | 1.0 |
| 14 | 3.0 | 2.0 | 0.50 | 0.04 | 0.50 | 0.04 | 1.0 |
| 15 | 3.0 | 2.0 | 0.50 | 0.04 | * 0.60 | 0.04 | 1.0 |
| 16 | 3.0 | 2.0 | 0.50 | 0.04 | 0.10 | 0.00 | 1.0 |
| 17 | 3.0 | 2.0 | 0.50 | 0.04 | 0.10 | 0.02 | 1.0 |
| 18 | 3.0 | 2.0 | 0.50 | 0.04 | 0.10 | 0.10 | 1.0 |
| 19 | 3.0 | 2.0 | 0.50 | 0.04 | 0.10 | * 0.20 | 1.0 |
| 20 | 3.0 | * 0.0 | 0.50 | 0.04 | 0.10 | 0.04 | 1.0 |
| 21 | 3.0 | 0.1 | 0.50 | 0.04 | 0.10 | 0.04 | 1.0 |
| 22 | 3.0 | 1.0 | 0.50 | 0.04 | 0.10 | 0.04 | 1.0 |
| 23 | 3.0 | 5.0 | 0.50 | 0.04 | 0.10 | 0.04 | 1.0 |
| 24 | 3.0 | 8.0 | 0.50 | 0.04 | 0.10 | 0.04 | 1.0 |
| 25 | 3.0 | * 10.0 | 0.50 | 0.04 | 0.10 | 0.04 | 1.0 |
| 26 | 3.0 | 2.0 | 0.50 | 0.04 | 0.10 | 0.04 | 0.8 |
| 27 | 3.0 | 2.0 | 0.50 | 0.04 | 0.10 | 0.04 | 0.9 |
| 28 | 3.0 | 2.0 | 0.50 | 0.04 | 0.10 | 0.04 | 1.2 |
| 29 | 3.0 | 2.0 | 0.50 | 0.04 | 0.10 | 0.04 | * 1.3 |
| 30 | 0.0 | 0.0 | 0.50 | 0.04 | 0.10 | 0.04 | — |

In the table, values out of the compositions defined in the prior invention 3 are marked with "*".

===Evaluation of Properties===

Concerning the samples Nos. 1 to 29 shown in Table 1, 58 samples having different compositions are prepared in total in the making methods of the first and the second examples. The prepared samples are left in air for 24 hours. Thereafter, measured is the dielectric constant $\in_{33}^T$ of each sample and obtained is the relative dielectric constant $\in r$ from the equation $\in r = \in_{33}^T / \in_0$. Also, measured are the electromechanical coupling coefficient Kp (%) and the mechanical quality factor Qm (%). Then, determined is the conformance of each sample with the following quantitative criteria: $\in r \geq 500$, $Kp \geq 25$, and $Qm \geq 500$.

Table 2 shows the measurement result.

TABLE 2

| | Making Method | | | | | |
|---|---|---|---|---|---|---|
| | First Example | | | Second Example (Property Changing Ratio %) | | |
| No. | $\in r$ | Kp (%) | Qm | Δ$\in r$ | ΔKp | ΔQm |
| * 1 | 257 | 42 | 1829 | 10.0 | 5.9 | 43.0 |
| 2 | 546 | 25 | 682 | 12.0 | 6.2 | 51.0 |
| 3 | 894 | 28 | 904 | 22.0 | 6.2 | 52.0 |
| 4 | 997 | 25 | 554 | 19.0 | 7.9 | 41.0 |
| * 5 | 1026 | 21 | 405 | 15.0 | 6.4 | 39.0 |
| 6 | 821 | 25 | 511 | 23.0 | 2.3 | 30.0 |
| 7 | 591 | 26 | 893 | 2.1 | 1.4 | 31.0 |
| * 8 | 377 | 22 | 621 | 1.7 | 0.9 | 14.0 |
| 9 | 1074 | 35 | 503 | 4.5 | 4.6 | 13.0 |
| 10 | 649 | 25 | 821 | 3.5 | 4.0 | 17.0 |
| * 11 | 322 | 22 | 1032 | 25.0 | 4.2 | 20.0 |
| * 12 | 482 | 27 | 914 | 5.9 | 6.5 | 31.0 |
| 13 | 742 | 28 | 683 | 5.2 | 6.3 | 29.0 |
| 14 | 1082 | 26 | 578 | 8.3 | 4.9 | 28.0 |
| * 15 | 1658 | 7.6 | 379 | 2.6 | 3.4 | 23.0 |
| 16 | 799 | 33 | 852 | 5.6 | 2.6 | 31.0 |
| 17 | 1062 | 26 | 748 | 5.4 | 3.4 | 24.0 |
| 18 | 1386 | 25 | 514 | 3.8 | 4.3 | 26.0 |
| * 19 | 2105 | 5.3 | 115 | 6.2 | 5.1 | 26.0 |
| * 20 | 800 | 13 | 108 | 4.2 | 2.3 | 19.0 |
| 21 | 823 | 25 | 658 | 4.8 | 4.5 | 20.0 |
| 22 | 853 | 26 | 821 | 6.2 | 4.7 | 27.0 |
| 23 | 910 | 30 | 734 | 12.0 | 6.7 | 26.0 |
| 24 | 922 | 26 | 523 | 13.0 | 7.2 | 24.0 |
| * 25 | 930 | 22 | 386 | 15.0 | 6.4 | 34.0 |
| * 26 | 812 | 20 | 678 | 3.6 | 5.2 | 21.0 |
| 27 | 820 | 26 | 788 | 5.4 | 4.1 | 27.0 |
| 28 | 880 | 31 | 612 | 8.2 | 6.3 | 27.0 |
| * 29 | 816 | 20 | 585 | 5.3 | 5.3 | 28.0 |
| 30 | 1389 | 45 | 48 | — | — | — |

★

In sample No. 30 containing only the base material without $Ba_nTiO_3$ and CuO, its $\in r$ factor is extremely high and its Qm factor is extremely low. As shown in piezoelectric properties of sample No. 1 in which only CuO is added to the base material and sample No. 20 in which only $Ba_nTiO_3$ is added to the base material, CuO tends to increase Qm significantly and $Ba_nTiO_3$ tends to maintain $\in r$ with increasing Qm.

Exploring in detail the relationship between piezoelectric properties and conformance of samples Nos. 1 to 5 whose compositions are the same except for the value x, which is the amount of $Ba_nTiO_3$. The samples Nos. 2 to 4 whose values x are respectively 0.5, 3.0, and 7.0% meet the criteria. In the piezoelectric material of x=0, that is, to which $Ba_nTiO_3$ is not added, Qm is three times greater than the criterion and $\in r$ equals about a half of the criterion; so, this piezoelectric material is not practical. In the sample No. 5 of x=10.0, $\in r$ sufficiently reaches to the criterion but Qm=405, which is 80% of the criterion; the sample No. 5 does not meet the criteria. However, compared to the sample No. 1 in which no $Ba_nTiO_3$ is added, Qm in the sample No. 5 is improved; the value of Qm in itself is acceptable for practical use. Thus, the appropriate range of the value x can be 0.5≤x<10.0. The value n can be 0.9≤n≤1.2, based on the samples Nos. 26 to 29. The value y indicating the amount of CuO can be 0.1≤y<10.0, based on the samples Nos. 20 to 25.

As a result, it is found that, while $Ba_nTiO_3$ can increase ∈r, adding a large amount of $Ba_nTiO_3$ decreases Kp and Qm. Also, it is confirmed that, while adding an inappropriate amount of CuO decreases Kp and Qm, adding an appropriate amount of CuO maintains Qm at a high value.

On the other hand, concerning the values a and b which show the composition of the base material, the sample No. 8 of a=0.95 does not meet the criteria in two piezoelectric performances: Kp and ∈r. The samples Nos. 6 and 7 of a=0 and 0.9 meet the criteria. That is, it can be said that the appropriate range of the value a is 0≤a≤0.9. Similarly, the appropriate ranges of the values b to d are 0≤b≤0.4, 0<c≤0.1, and 0≤d≤0.1. The following tendencies are found from the piezoelectric properties corresponding to the values of a to d: a large amount of Na or Li in the base material decreases the factors of ∈r and Kp; a small amount of Ta decreases the ∈r factor; a large amount of Ta decreases the factors of Kp and Qm; and a large amount of Sb decreases the factors of Kp and Qm.

As mentioned above, the piezoelectric material A according to the examples of the invention is the sample having the general formula $\{(K_{1-a}Na_a)_{1-b}Li_b\}(Nb_{1-c-d}Ta_cSb_d)O_3$+x mol % $Ba_nTiO_3$+y mol % CuO where 0.5≤x<10.0, 0.5≤y<10.0, 0≤a≤0.9, 0≤b≤0.4, 0<c≤0.1, 0≤d≤0.1, and 0.9≤n≤1.2. Further, of the piezoelectric materials satisfying the foregoing ranges, more preferable is a piezoelectric material whose ∈r, Kp, and Qm are ∈r≥500, Kp≥25, and Qm≥500.

===Optimum Composition of Piezoelectric Material===

Taking into further consideration piezoelectric properties of the samples shown in Table 2, it can be recognized that there are samples (Nos. 3 and 22) having remarkably excellent piezoelectric properties of ∈r≥800, Kp≥25, and Qm≥800. Having this level of piezoelectric properties enables application to piezoelectric devices for which only PZT has ever been used, such as an ultrasonic motor. So, the values x, y, a to d, and n which allow ∈r≥800, Kp≥25, and Qm≥800 (optimum ranges) were obtained.

Figure 2:
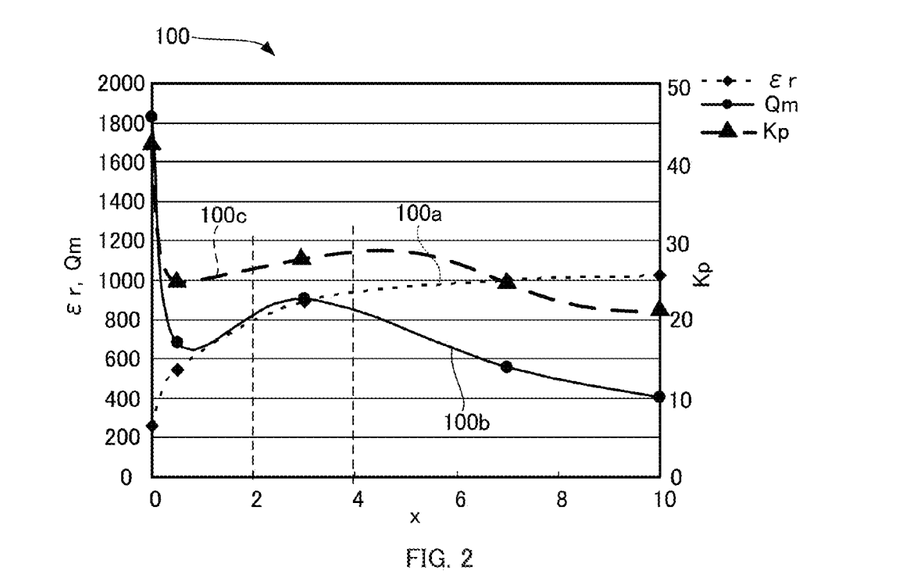
FIG. 2 is a diagram showing a relationship among relative dielectric constant $\in$r, mechanical quality factor Qm, and x of a compound having the general formula $(K_{1-a}Na_a)_{1-b}Li_b(Nb_{1-c-d}Ta_cSb_d)O_3 + x$ mol % $Ba_nTiO_3 + y$ mol % CuO, the compound constituting a piezoelectric material according to the examples of the invention.

Specifically, the optimum ranges of the values x, y, a to d, and n are obtained by interpolating between the values x, y, a to d, and n which are discrete in Table 2. For example, in order to acquire the optimum range of value x, the fitting curves showing the relationships between x and each of ∈r and Qm are obtained based on the relationships between discrete value x and each of discrete values ∈r and Qm of the samples Nos. 1 to 5. The values y, a to d, and n other than value x are set to y=0.5, a=0.5, b=0.04, c=0.1, d=0.04, and n=1.0 as reference values which are the median of the appropriate range. The graph 100 in FIG. 2 shows the relationships between the value x and each of ∈r, Qm, and Kp. From the two fitting curves (100a and 100b) showing the relationship between x and ∈r and the relationship between x and Qm of the graph 100, the value x that realizes ∈r≥800 and Qm≥800 is obtained, that is, 2.0≤x≤4.0. In the graph, the values x that realize ∈r≈800 and Qm≈800 are indicated by dotted lines. As shown in the fitting curve 100c showing the relationship between the value x and Kp, Kp within the ranges of x and y meets the criterion Kp≥25.

Figure 3:
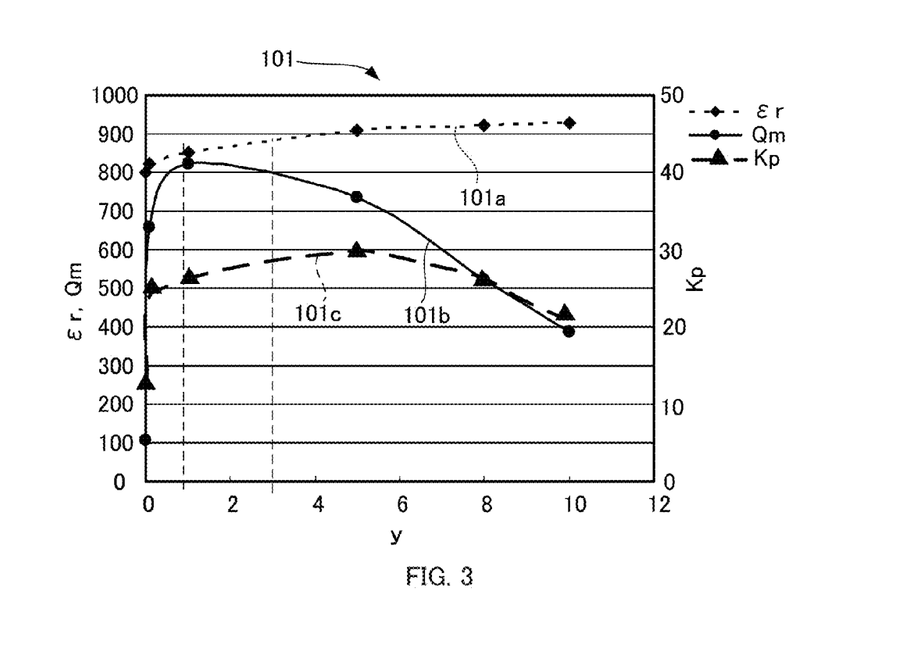
FIG. 3 is a diagram showing relationships between the value y of the compound and each of relative dielectric constant $\in$r and mechanical quality factor Qm.
Figure 4:
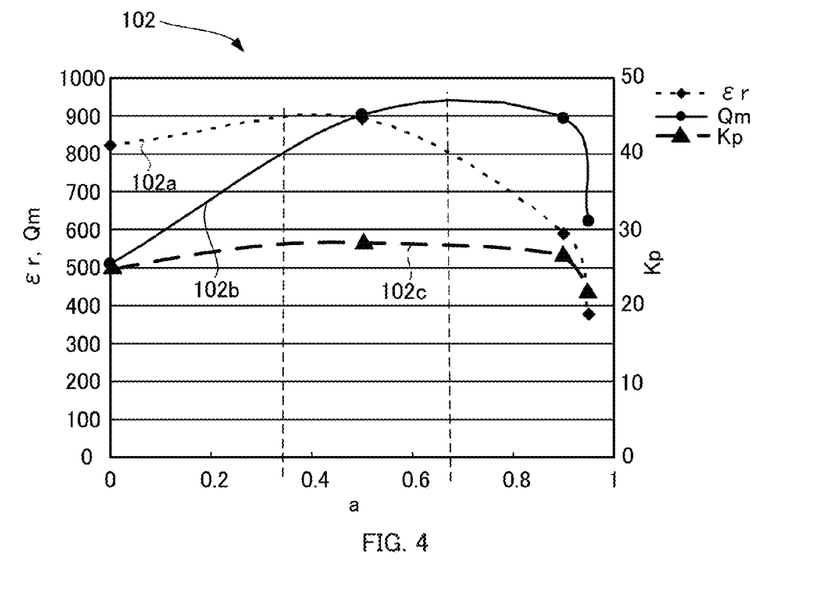
FIG. 4 is a diagram showing relationships between the value a of the compound and each of relative dielectric constant $\in$r and mechanical quality factor Qm.
Figure 5:
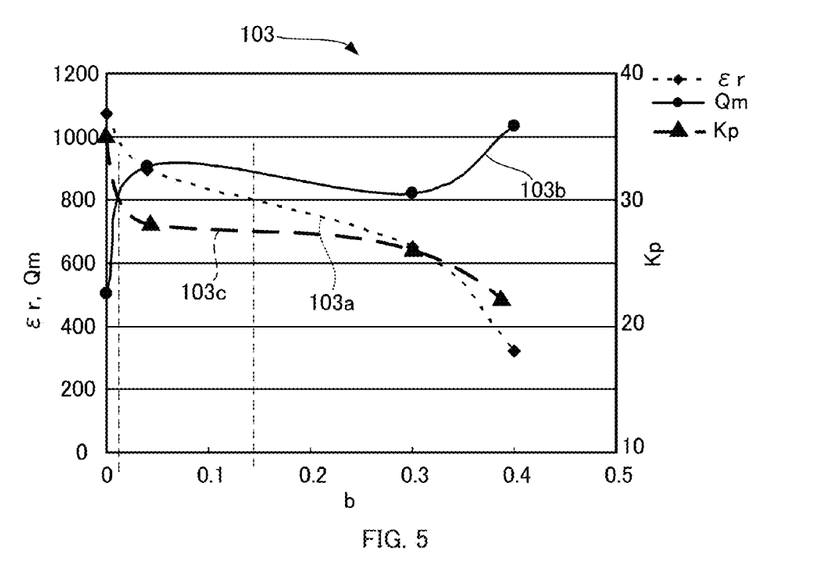
FIG. 5 is a diagram showing relationships between the value b of the compound and each of relative dielectric constant $\in$r and mechanical quality factor Qm.
Figure 6:
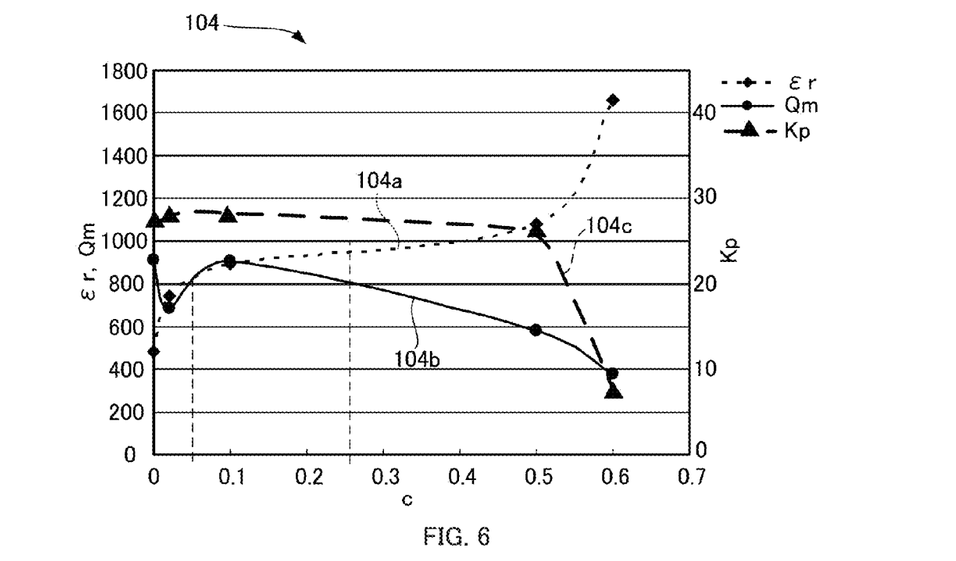
FIG. 6 is a diagram showing relationships between the value c of the compound and each of relative dielectric constant $\in$r and mechanical quality factor Qm.
Figure 7:
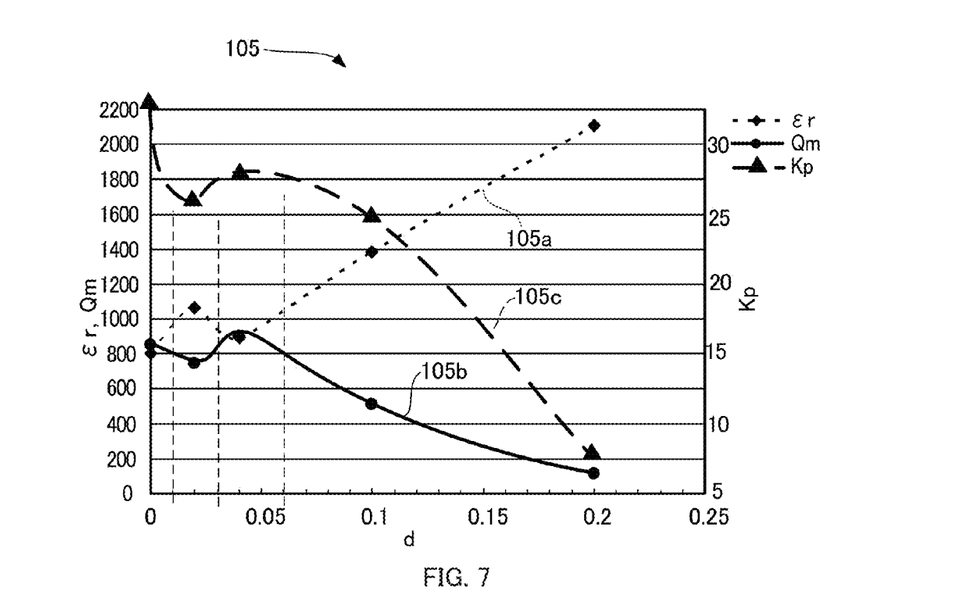
FIG. 7 is a diagram showing relationships between the value d of the compound and each of relative dielectric constant $\in$r and mechanical quality factor Qm.
Figure 8:
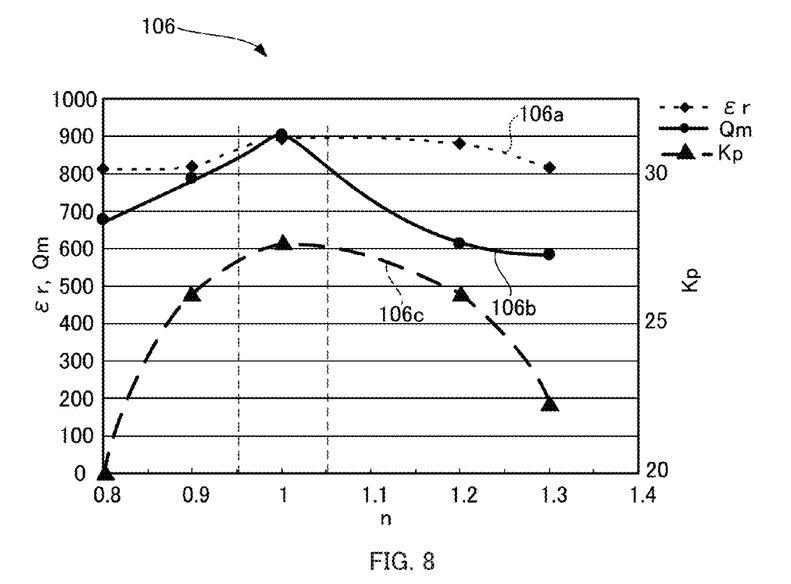
FIG. 8 is a diagram showing relationships between the value n of the compound and each of relative dielectric constant $\in$r and mechanical quality factor Qm.

Similarly, obtained are optimum ranges of the values y, a to d, and n. For example, it is sufficient to obtain the optimum range of the value y from piezoelectric properties of the samples Nos. 3 and 20 to 25. That is, for the discrete value y, the following reference values are used: x=3.0, a=0.5, b=0.04, c=0.1, d=0.04, and n=1.0. Then, obtained is the optimum range of the value from the fitting curves showing the relationships between the value y and each of the following factors: ∈r and Qm. The graph 101 in FIG. 3 shows the relationships between the value y and each of ∈r, Qm, and Kp. From the fitting curves (101a to 101c) shown in FIG. 3, obtained is the value that reliably realizes ∈r≥800, Qm≥800, and Kp≥25; the result, 1.0≤y≤3.0.

Similarly, it is sufficient to obtain the optimum ranges of the values a to n. In FIGS. 4 to 8, the graphs (102 to 106) show the relationships between each of the values a to d and n, and each of ∈r, Qm, and Kp. From the fitting curves shown in the figures (102a to 106a, 102b to 106b, and 102c to 106c), obtained is the optimum ranges of the values: 0.35≤a≤0.65, 0.03≤b≤0.15, 0.05≤c≤0.25, 0≤d≤0.01 or 0.03≤d≤0.06, and 0.95≤n≤1.05.

Table 2 shows the measured values of ∈r, Kp (%) and Qm (%) of samples prepared in the making method of the first example; in addition, Table 2 shows property changing ratios (Δ∈r, ΔK, and ΔQm) of the piezoelectric properties (∈r, K, and Qm) of the samples that were prepared in the making method of the second example and had the same composition. Further, in Table 2, the compositions out of the ranges defined in the prior invention 3 are marked with "*"

The property changing ratios will be described below using the dielectric constant ∈r as an example. Defining a dielectric constant ∈r1 as a dielectric constant of the piezoelectric material A having a certain composition and prepared in the making method of the first example, and defining a dielectric constant ∈r2 as a dielectric constant of the piezoelectric material A having the same certain composition and prepared in the making method for the second example, the property changing ratio Δ∈r (%) of the dielectric constants is obtained by the following equation.

$$\Delta\in r = \{(\in r2 - \in r1)/\in r1\} \times 100$$

If the property deteriorates compared to the making method of the first example, ∈r2−∈r1<0. That is, the property changing ratio becomes a negative value. As a result shown in the Table 2, all samples prepared in the making method for the second example are better in piezoelectric properties than the samples prepared in the making method of the first example, regardless of their composition.

<Improvement of Properties>

Figure 1:
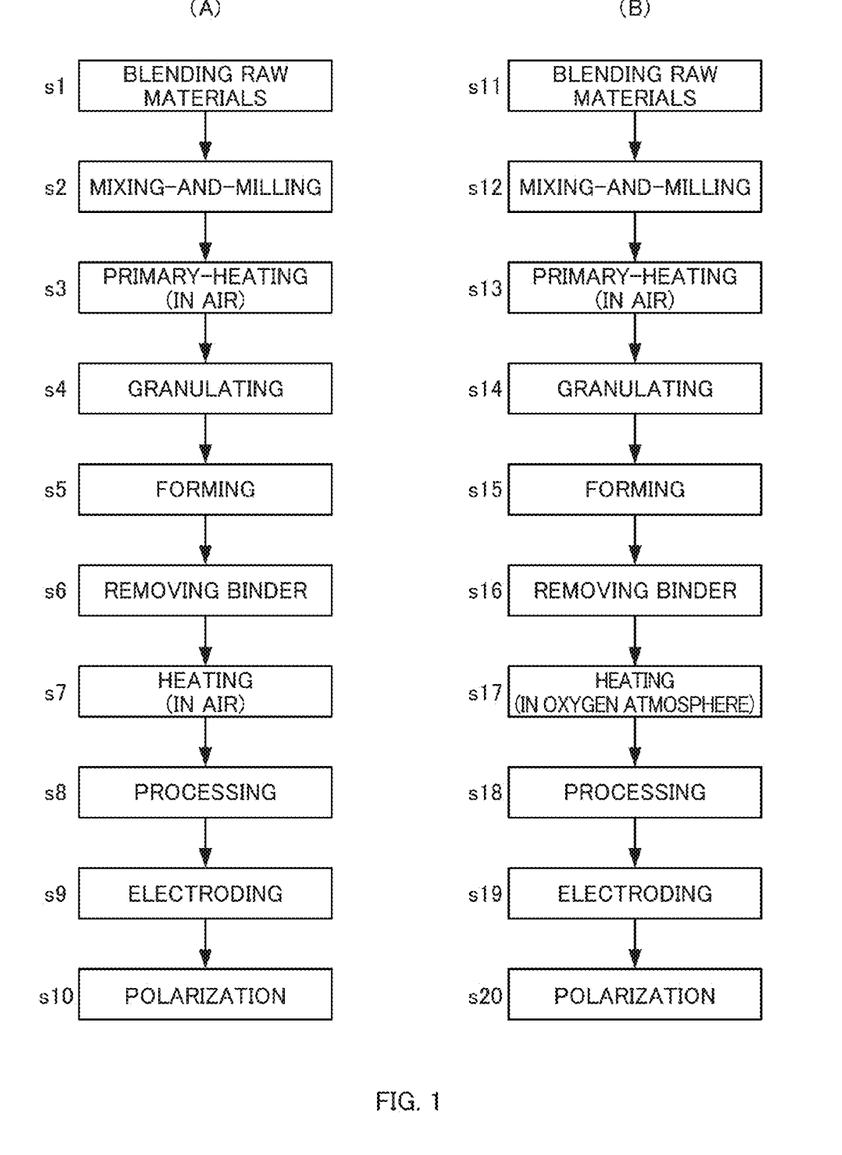
FIGS. 1A and 1B are process charts for describing a method for making piezoelectric material.
Figure 9:
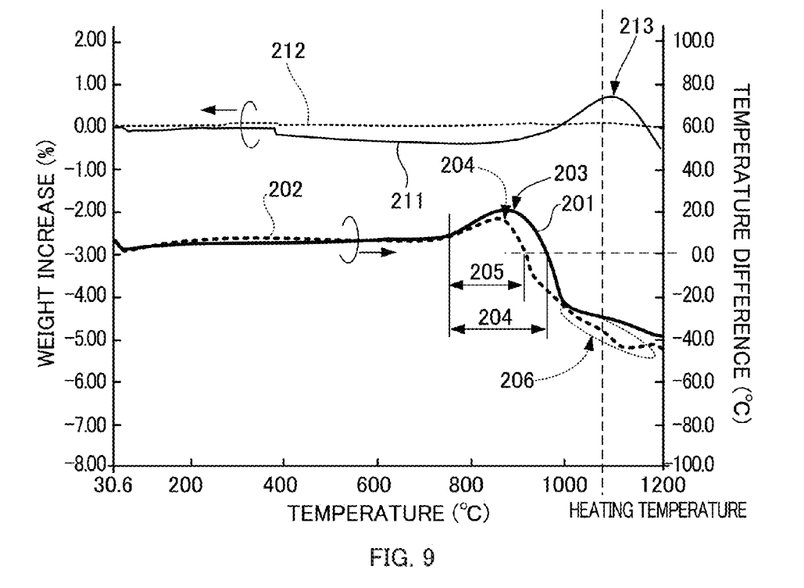
FIG. 9 is a graph showing the TG/DTA result of a piezoelectric material A having the general formula $(K_{1-a}Na_a)_{1-b}Li_b(Nb_{1-c-d}Ta_cSb_d)O_3 + x$ mol % $Ba_nTiO_3 + y$ mol % CuO which is made in methods according to a first example and a second example.

As a result shown in the Table 2, it is confirmed that heating the samples in an oxygen atmosphere improves properties of the piezoelectric material A. Concerning one of the reasons for this improvement, it can be considered that crystallization is further promoted. Thus, after shaping process (s5, s15) of FIG. 1, the raw materials of the piezoelectric material A are heated raising the temperature at a certain heating rate. During the heating process, a well-known TG/DTA (Thermo Gravimetry/Differential Thermal Analysis) is performed to measure simultaneously the followings: the changes (%) in weight from the initial weight; and the thermal difference (temperature difference (° C.) between the reference material and the piezoelectric material A). FIG. 9 shows a TG/DTA result. In the figure, a graph showing properties when heated in an oxygen atmosphere is indicated by the solid line, and graph showing properties when heated in air is indicated by the dotted line. The heating temperature is about 1100° C.

As shown in differential thermal characteristic curves (201 and 202) in FIG. 9, exothermic reactions accompanying crystallizations occur at about 750° C. and the peaks (203 and 204) of the exothermic reactions appear at about 900° C. The peak 203 in the differential thermal characteristic curve 201 of heating in an oxygen atmosphere is greater than the peak 204 in the differential thermal characteristic curve 202 of heating in air. The temperature range 204 for the exothermic reaction is wider than the temperature range 205 of heating in air. This shows that heating the materials in an oxygen atmosphere promotes crystallization further.

As shown in differential thermal characteristic curves on the higher side than the crystallization temperature, in the differential thermal characteristic curve 202 of heating in air, the decline 206 of the temperature difference appears around the heating temperature; the decline may be caused by endothermic reaction due to the heat of solution of alkaline components. On the other hand, in the characteristic curve of heating in an oxygen atmosphere, endothermic reaction around the heating temperature does not appear, which shows that alkaline components are enclosed in the crystal structure. As for characteristics in weight increase, a peak 213 showing a weight increase accompanying oxidation appears in the characteristic curve 211 of heating in an oxygen atmosphere, around temperatures corresponding to the peaks (203 and 204) of the exothermic reactions accompanying crystallizations. On the other hand, a weight increase accompanying oxidation does not appear in the weight increase curve 212 for heating in air.

Thus, it can be considered as follows: in samples prepared in the making method for the second example, which are heated in an oxygen atmosphere, crystallization is promoted; accompanying the crystallization, oxygen and alkaline components are enclosed in the crystal structure; and this makes it possible to produce ideal crystal structures with few oxygen vacancies to improve piezoelectric properties. When measuring the density of the prepared samples, it is confirmed that the samples prepared in the making method for the second example are 5 to 10% greater in density and have denser crystal structure than the samples prepared in the making method of the first example.

Further, as shown in Table 2, in the samples prepared in the making method for the second example, the improvement of Qm property is particularly remarkable. Compared to the first example, some samples (Nos. 2 and 3) improve in Qm 50% or more. The improvement of Qm property by adding CuO is known on the way to the prior invention 3; in terms of this point, the reason of this improvement can be said that heating in an oxygen atmosphere reinforces improvement of Qm by CuO. In order to analyze how CuO improves Qm property, the crystal structure of the piezoelectric material A is observed by means of an electron microscope.

Figure 10:
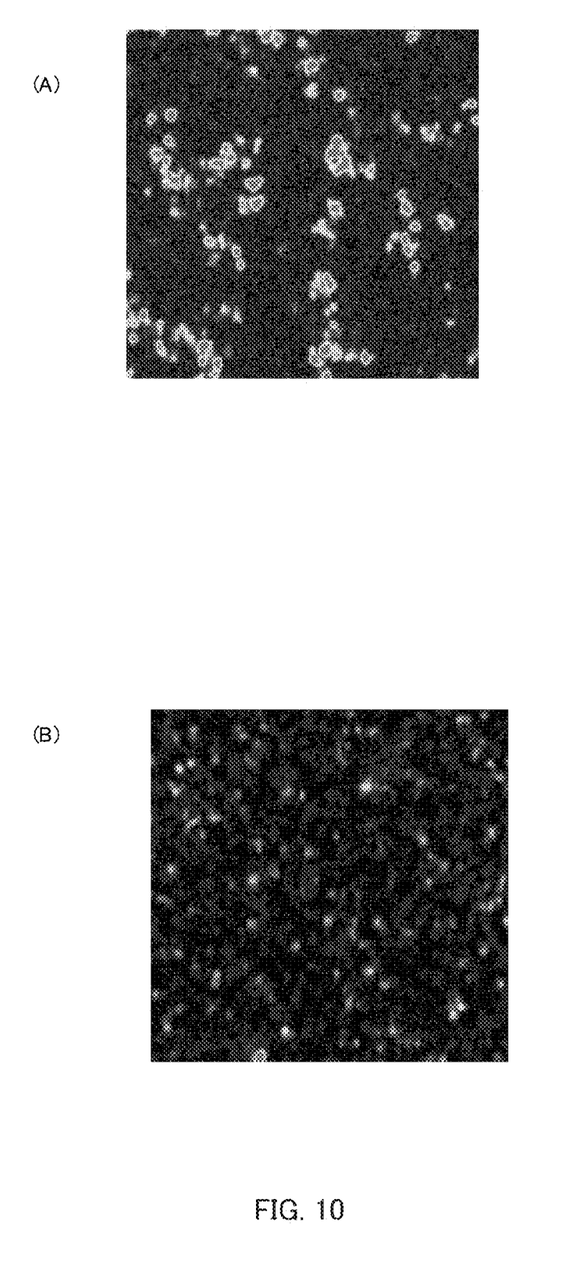
FIGS. 10A and 10B are electron micrographs of the piezoelectric material A.
Figure 11:
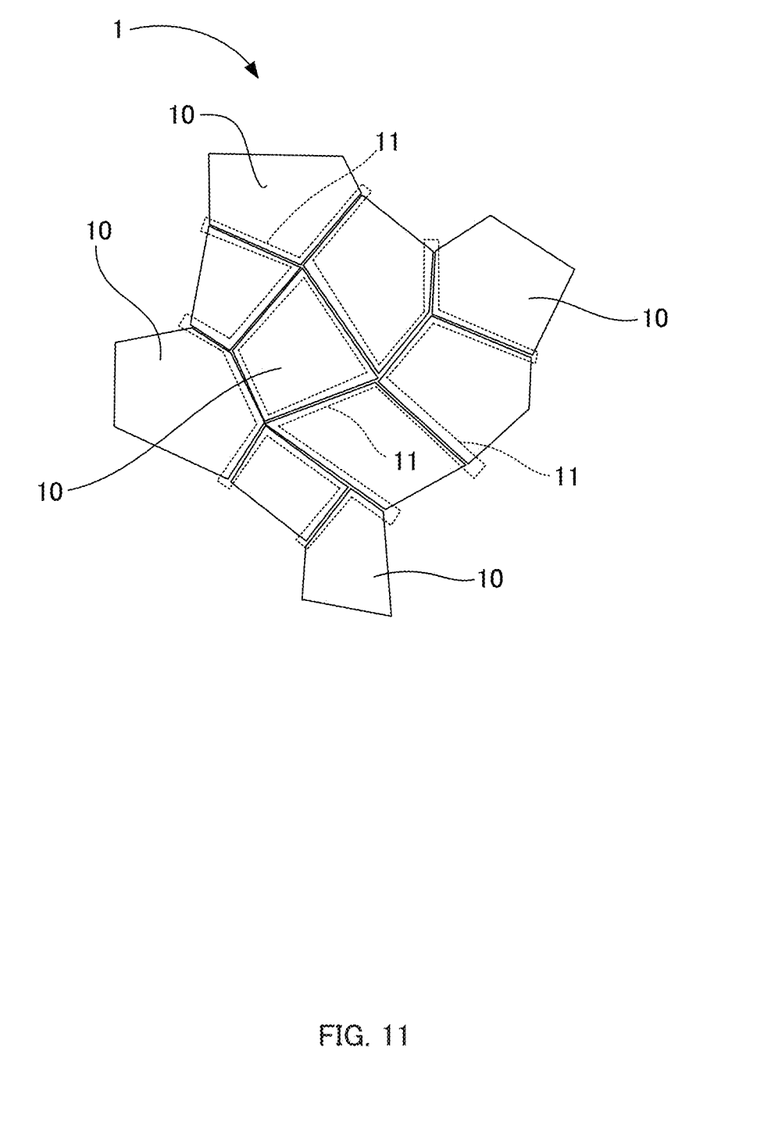
FIG. 11 is a schematic diagram showing the structure of a piezoelectric material.

FIG. 10 is electron micrographs of the piezoelectric material A having a certain composition. FIGS. 10A and 10B show respectively the piezoelectric material A having the composition and prepared in the method for the first example, and the piezoelectric material A having the same composition and prepared in the method for the second example. As shown in the micrographs of FIG. 10, whereas CuO (white dots in the micrographs) is unevenly distributed across the piezoelectric material A prepared in the making method of the first example, CuO is uniformly distributed through the piezoelectric material A prepared in the making method for the second example. The following reasons can be considered: the piezoelectric material 1 are composed of grains (domain) 10 connected like a mosaic as shown in FIG. 11; if substances containing copper (Cu) penetrate a boundary (grain boundary) 11 between the domains 10, facilitated is a so-called "pinning effect", which the polarization direction of each domain is suddenly reversed at a certain frequency; as a result, Qm improves. Also, it can be considered that preparing the piezoelectric material A in the making method of the first example enables a more uniform distribution of the copper so that the pinning effect appears in each of the domains at the same time. As well known, the magnitude of Qm corresponds to the sharpness of resonance curves electrically measured. Uniform polarization of the domains 10 improves Qm.

===Supporting Experimental Example===

As mentioned above, it is found that the piezoelectric materials A heated in an oxygen atmosphere have more excellent piezoelectric properties than the piezoelectric materials A heated in air. Now, confirmation was made whether heating in an oxygen atmosphere improves properties of other alkali niobate-based piezoelectric materials. A method for making piezoelectric materials for this supporting experimental example is heating in an oxygen atmosphere KNN-based piezoelectric materials, which are typical alkali niobate-based piezoelectric materials. The making method for the supporting experimental example has the same procedure as the procedure shown in FIG. 1B, and only raw material is different therefrom.

Table 3 shows composition of various piezoelectric materials prepared in the making method of the supporting experimental example.

TABLE 3

| | | Piezoelectric Material A whose base material is $K_xNa_{(1-x)}NbO_3$ | |
|---|---|---|---|
| No. | x | Additional Matter | Amount (wt %) |
| 31 | 0.5 | CuO | 1.00 |
| 32 | 0.5 | $Fe_2O_3$ | 1.00 |
| 33 | 0.5 | $Co_2O_3$ | 0.10 |
| 34 | 0.7 | Zn-based glass | 0.08 |
| 35 | 0.5 | Bi-based glass | 0.10 |
| 36 | 0.1 | Zn-based glass | 0.07 |
| 37 | 0.5 | MnO | 1.00 |
| 38 | 0.5 | NiO | 1.00 |
| 39 | 0.5 | $Al_2O_3$ | 1.00 |
| 40 | 0.5 | None | 0.00 |

In Table 3, the sample No. 40 is the piezoelectric material with no additional matter to KNN, and the sample No. 31 is the piezoelectric material in which CuO is added as an additional matter. The samples Nos. 34 to 36 are, of piezoelectric materials according to the prior invention 1 in which glass is added to KNN, the ones with representative compositions. The other samples are the piezoelectric materials in which general additional matters are added to KNN. Concerning KNN-based piezoelectric materials having the compositions shown in Table 3, prepared are samples which have been heated in air, and samples which have been heated in an oxygen atmosphere. Then, piezoelectric properties of the samples are measured.

Table 4 shows the measurement result.

TABLE 4

| | Making Method | | | | | |
|---|---|---|---|---|---|---|
| | First Exampe | | | Supporting Experiment Example (Property Changing Ratio %) | | |
| No. | $\epsilon r$ | Kp (%) | Qm | $\Delta \epsilon r$ | $\Delta Kp$ | $\Delta Qm$ |
| 31 | 198 | 36 | 1862 | 8.2 | 8.7 | 32.0 |
| 32 | 451 | 34 | 123 | 20.0 | 5.3 | 11.0 |
| 33 | 340 | 40 | 245 | 26.0 | 11.0 | 17.0 |

TABLE 4-continued

| | Making Method | | | | | |
|---|---|---|---|---|---|---|
| | First Exampe | | | Supporting Experiment Example (Property Changing Ratio %) | | |
| No. | $\epsilon r$ | Kp (%) | Qm | $\Delta \epsilon r$ | $\Delta$Kp | $\Delta$Qm |
| 34 | 81 | 43 | 400 | 14.0 | 9.3 | 10.0 |
| 35 | 366 | 31 | 75 | 17.0 | 8.8 | 27.0 |
| 36 | 503 | 19 | 121 | 15.0 | 8.9 | 34.0 |
| 37 | 257 | 33 | 285 | 11.0 | 7.6 | 15.0 |
| 38 | 434 | 34 | 129 | 9.6 | 10.0 | 18.0 |
| 39 | 499 | 36 | 158 | 5.3 | 10.0 | 13.0 |
| 40 | 499 | 33 | 86 | 15.0 | 10.0 | 16.0 |

Table 4 shows the following measurements concerning KNN-based piezoelectric materials: measurements of piezoelectric properties ($\epsilon r$, Kp, and Qm) of piezoelectric materials prepared in the making method of the first example; and property changing ratios ($\Delta \epsilon r$, $\Delta K$, and $\Delta Qm$) of the piezoelectric properties ($\epsilon r$, K, and Qm) of the piezoelectric materials which have the same composition but are prepared in making method of the supporting experimental example. As a result shown in Table 4, it is confirmed that heating KNN-based piezoelectric materials in an oxygen atmosphere improves piezoelectric properties of the KNN-based piezoelectric materials. Since KNN contains fewer kinds of rare metals in its composition than the piezoelectric material A, it is possible to provide KNN-based piezoelectric materials at lower cost than the piezoelectric material A. In a device in which piezoelectric elements are embedded, its cost rather than its performance is sometimes the main concern, and vise versa. Therefore, depending on use of or demand for a device in which piezoelectric elements are embedded, it is sufficient to employ either of KNN or the piezoelectric material A as a piezoelectric material constituting the piezoelectric elements.

Incidentally, it is confirmed that heating in an oxygen atmosphere improves the properties of all piezoelectric materials shown in Table 3 whose compositions are different (for example, one is KNN, which is one of the representative alkali niobate-based piezoelectric materials, and others are piezoelectric materials in which various additives are added to KNN). Therefore, it can be considerably expected that heating in an oxygen atmosphere improves not only the properties of KNN or the piezoelectric materials A mentioned above, but also the properties of other alkali niobate-based piezoelectric materials.

INDUSTRIAL APPLICABILITY

The invention can be applied to devices or elements which utilize the piezoelectric properties, such as apiezoelectricbuzzer and an ultrasonic motor.

REFERENCE SIGNS LIST

1 piezoelectric material, 10 grain (domain), 11 grain boundary,
100 to 106 graphs of piezoelectric properties,
201, 202 differential thermal characteristic curve, 211, 212 weight increase curve,
s1, s11 blending process, s2, s12 mixing-and-milling process,
s3, s13 primary-heating process, s7, s17 heating process

The invention claimed is:
1. A method for making an alkali niobate-based piezoelectric material having the general formula $\{(K_{1-a}Na_a)_{1-b}Li_b\}(Nb_{1-c-d}Ta_cSb_d)O_3 + x$ mol % $Ba_nTiO_3 + y$ mol % CuO where $0.35 < a < 0.65$, $0.03 \leq b \leq 0.15$, $0.05 \leq c \leq 0.25$, $0 \leq d \leq 0.01$ or $0.03 \leq d \leq 0.06$, $2.0 \leq x \leq 4.0$, $1.0 \leq y \leq 3.0$, and $0.95 \leq n \leq 1.05$,
and having characteristics of: an electromechanical coupling coefficient Kp$\geq$25%,
a relative dielectric constant $\epsilon r \geq 800$, and
a mechanical quality factor Qm$\geq$800,
the method comprising:
mixing a solvent and a raw material of a compound that is the piezoelectric material;
primary-heating a mixture of the solvent and the raw material of the compound, at a temperature lower than a sintering temperature;
forming into a certain shape the primary-heated mixture in which a binder is added; and
heating the shaped product to sinter in an atmosphere consisting of oxygen.
2. The method for making an alkali niobate-based piezoelectric material according claim 1, wherein
the piezoelectric material contains a compound having the general formula $K_zNa_{(1-z)}NbO_3$, wherein $0.02 \leq z \leq 0.5$.

* * * * *